United States Patent [19]

Bower

[11] 4,148,132
[45] Apr. 10, 1979

[54] METHOD OF FABRICATING A TWO-PHASE CHARGE COUPLED DEVICE

[75] Inventor: Robert W. Bower, Manhattan Beach, Calif.

[73] Assignee: TRW Inc., Redondo Beach, Calif.

[21] Appl. No.: 656,485

[22] Filed: Feb. 9, 1976

Related U.S. Application Data

[60] Division of Ser. No. 527,680, Nov. 27, 1974, Pat. No. 3,967,306, which is a continuation-in-part of Ser. No. 384,601, Aug. 1, 1973, abandoned.

[51] Int. Cl.² .................................. H01L 21/26
[52] U.S. Cl. ........................ 29/571; 148/1.5; 148/187; 357/24
[58] Field of Search ............... 148/1.5, 187; 357/24; 29/571

[56] References Cited

U.S. PATENT DOCUMENTS

| | | | |
|---|---|---|---|
| 3,760,202 | 9/1973 | Konsonocky | 357/24 X |
| 3,789,267 | 1/1974 | Krambeck et al. | 357/24 |
| 3,795,847 | 3/1974 | Engeler et al. | 357/24 X |
| 3,819,959 | 6/1974 | Chang et al. | 357/24 X |
| 3,865,652 | 2/1975 | Agusta et al. | 148/187 |
| 3,918,997 | 11/1975 | Mohsen et al. | 148/1.5 |

OTHER PUBLICATIONS

Bower et al., "A High Density Overlapping Gate Charge Coupled Device Array", Technical Digest, 1973 Internat. Electron Devices Meeting, Dec. 3, 1973, pp. 30–32.

Primary Examiner—G. Ozaki
Attorney, Agent, or Firm—Robert W. Keller; John J. Connors

[57] ABSTRACT

In a charge coupled device provided with a two-phase overlapping gate structure, charge flow directionality is built into the structure by forming an asymmetrical potential well beneath each gate electrode with a single offset mask. High packing density is achieved in an array of staggered bits and with each bit being designed to have a geometry of minimum size.

6 Claims, 15 Drawing Figures

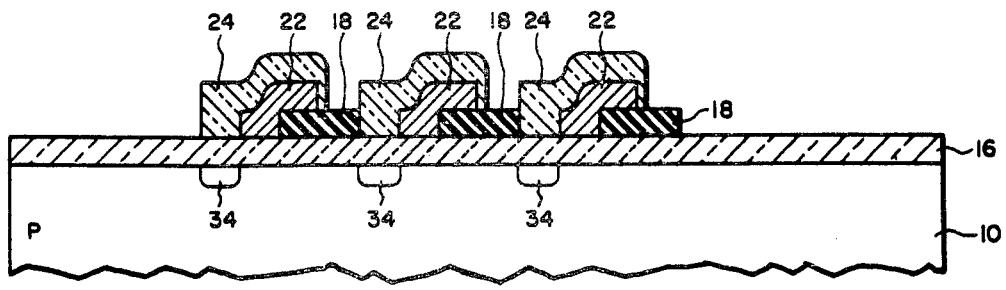
Fig. 7
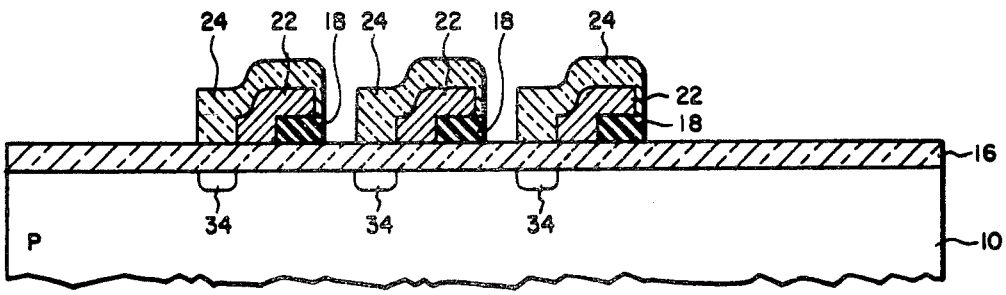
Fig. 8
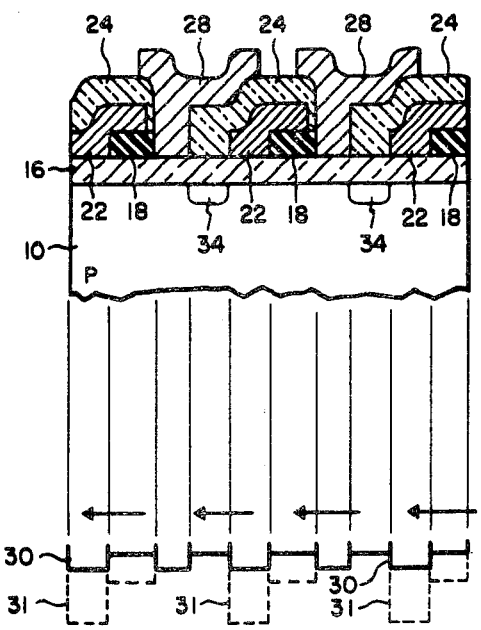
Fig. 9
Fig. 9B

METHOD OF FABRICATING A TWO-PHASE CHARGE COUPLED DEVICE

CROSS-REFERENCE TO RELATED APPLICATIONS

This application is a division of application Ser. No. 527,680, filed Nov. 27, 1974, now U.S. Pat. No. 3,967,306, entitled "Asymetorial Wall Charge Coupled Device," which in turn is a continuation-in-part of application Ser. No. 384,601, filed Aug. 1, 1973, now abandoned, and assigned to the same assignee herein.

BACKGROUND OF THE INVENTION

This invention relates to improvements in the manufacture of charge coupled devices, and particularly to improvements designed to reduce the size and complexity of such devices that are constructed with two-phase overlapping gate electrodes and operate with unidirectional charge flow.

It is known to construct charge coupled devices that operate with charge flowing in one direction. One such device is described in Electronics, June 21, 1971, on pages 58 and 59. In that device the undirectional aspect is produced by fabricating each gate electrode to have a different capacitance from its neighboring gate electrode. These two laterally adjacent gate electrodes are connected together to form one phase with an asymmetrical potential well beneath it. The next two neighboring gate electrodes of different capacitance are connected to form the other phase with an asymmetrical well beneath it, and so on.

Such a two-phase charge coupled device requires the interconnection of two adjacent gate electrodes to form a single asymmetrical potential well that specifies the direction of charge flow. This poses formidable fabrication problems in constructing a device with overlapping gate electrodes wherein two sets of the overlapping gate electrodes are arranged in two different levels. In order to connect adjacent gate electrodes, it is necessary to form interconnections between the two levels.

These problems are magnified when the memory bits or charge storage elements are arranged in serpentine fashion, because of the necessity of making cross-over connections between the rows of bits. That is, because the directionality in the flow of charge between bits in a given row is effected through the interconnection of adjacent gate electrodes, in order to direct the flow of charge along a serpentine course it is necessary to reverse the interconnections to make a transition from one row to the next, thereby causing the interconnections to cross over one another.

SUMMARY OF THE INVENTION

A two phase overlapping gate structure is provided by employing a single offset mask to produce an asymmetrical potential well beneath each one of the gate electrodes. The mask pattern is offset relative to each of the overlapping gate electrodes, and at least part of the pattern is retained as a permanent element of the operative structure. The processing steps are arranged to have the opposite effect in the adjacent gate regions so as to establish the proper asymmetrical potential well distribution that is necessary to give directionality to the charge flow.

In one embodiment, the processing steps are designed to establish a non-uniform capacitance in each gate region, with the resulting distribution of non-uniform capacitance being such that when voltage is applied to the gate electrodes the potential wells in each of the gate regions all have the same charge directional sense.

In another embodiment, ion implants are used to introduce an offset voltage into a portion of the capacitor formed in each gate region. Accordingly, the effect that is produced on the surface potential by a voltage applied to the gate electrode is different in the region of the ion implant from that produced in the non-implanted region.

BRIEF DESCRIPTION OF THE DRAWING

FIGS. 2-8 are sectional views showing a step-by-step process of fabricating the device of FIG. 1;

FIG. 9 is a section taken along line 9—9 of FIG. 1;

FIG. 9b is a diagram showing the potential well distribution in the substrate shown in FIG. 9.

DESCRIPTION OF THE PREFERRED EMBODIMENTS

Figure 1:
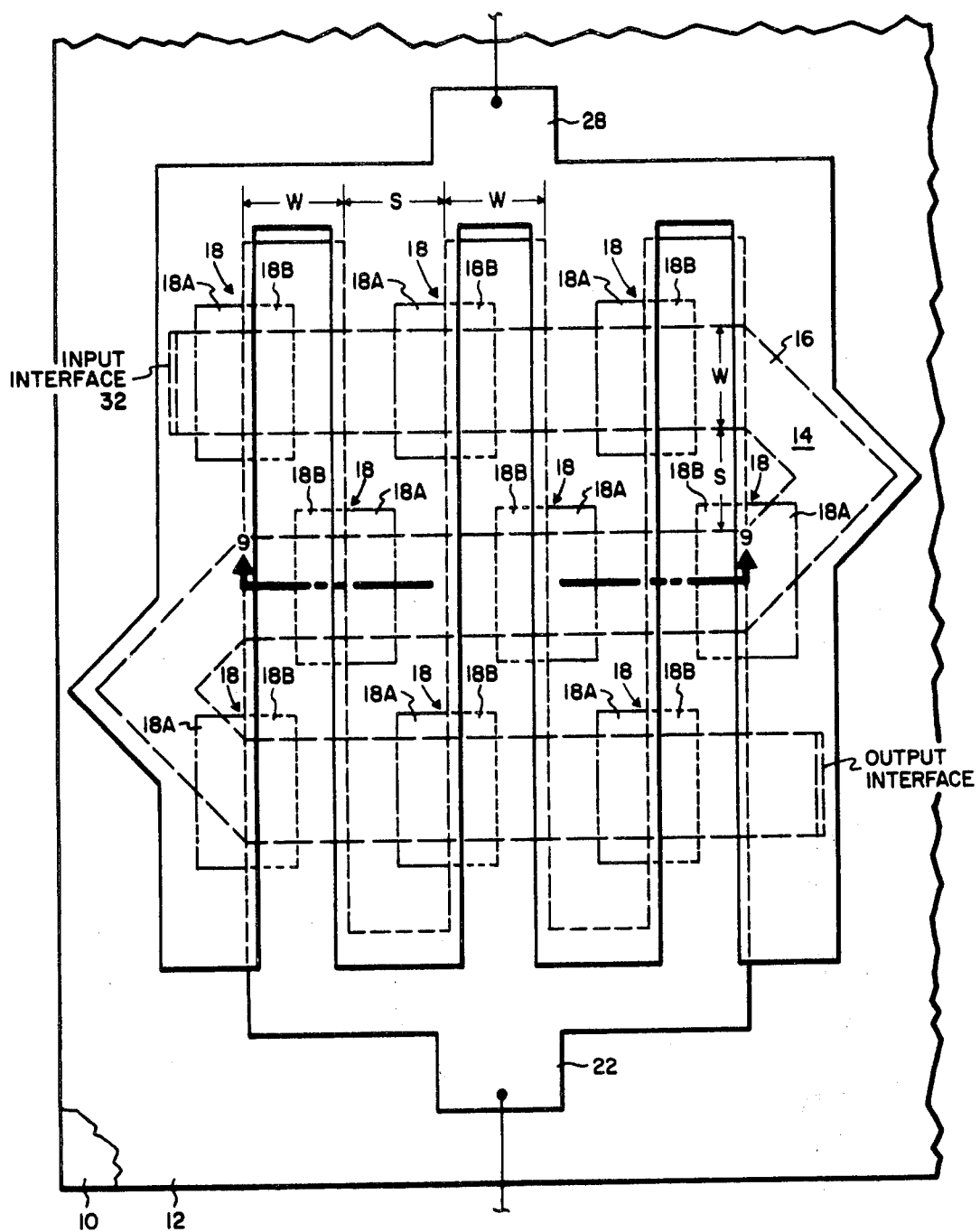
FIG. 1 is a top plan view of a charge coupled device according to the invention.
Figure 2:
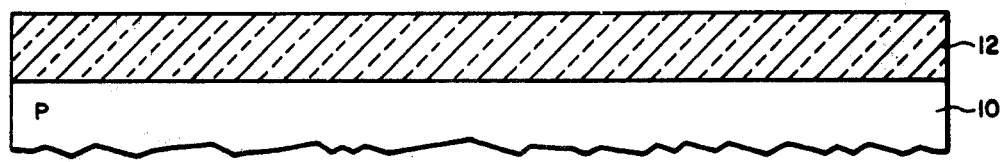

In FIGS. 1 and 9 of the drawing, there is shown a nine bit charge coupled device, according to the invention, in which the bits are arranged in a serpentine array. Only nine bits are shown for ease in description, and it will be understood that in an actual device the number of bits can be many times that shown.

In FIGS. 2 through 9 there is illustrated a step-by-step process for fabricating the device of FIGS. 1 and 9. It will be convenient in the description that follows to refer back to the finished structure of FIGS. 1 and 9 as the structure develops from the fabrication steps illustrated in FIGS. 2 through 9.

Referring now specifically to FIGS. 2-9 and generally to FIGS. 1 and 9, a substrate 10 is provided from suitable semiconductive material, such as p-type silicon. The first step in the fabrication procedure is to grow a thick layer 12 of silicon dioxide on the silicon substrate 10. The thick oxide layer 12 may be 10,000 Å in thickness and may be formed according to conventional practice by heating the substrate at a suitable temperature in the vicinity of 1000° C. until the desired thickness is attained.

Figure 3:
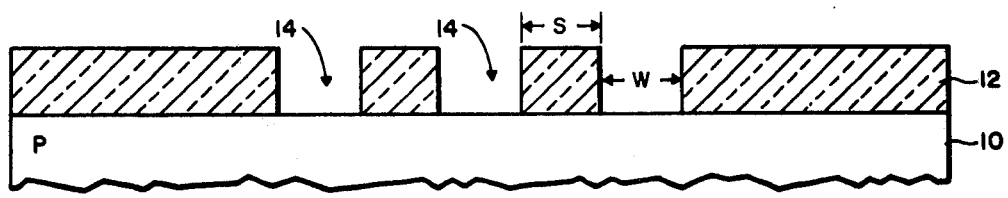
Figure 4:
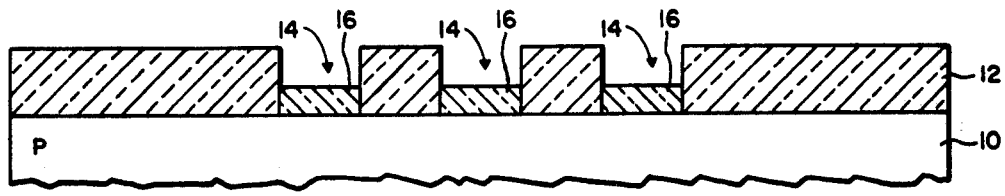
Figure 5:
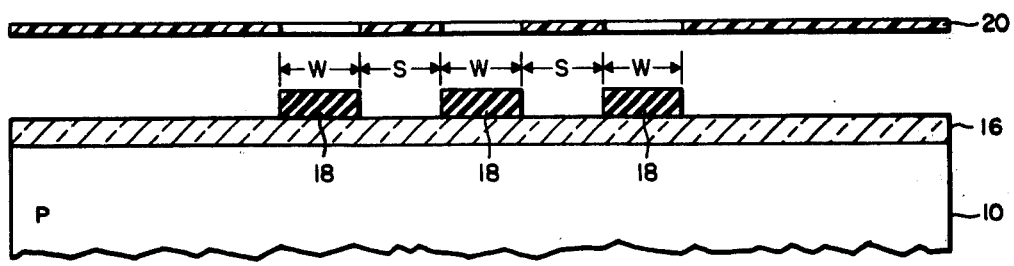

The next step in the manufacturing process is to etch away a channel 14 in the thick oxide layer 12. The channel 14 defines the boundaries of the charge coupled device and the packing density of the array and generally traces the path along which the electrical charge will be constrained to flow in the array. The channel 14 may be formed by conventional photolithographic masking and etching techniques that are well known to those skilled in the art of microelectronic circuit technology. In the particular embodiment illustrated herein, the channel 14 follows a sinuous or serpentine path, as shown in FIG. 1. FIGS. 3 and 4 are viewed from the same aspect as a vertical section taken across the width of the channel 14. The width W of the channel 14 is equal to the spacing S between the adjacent parallel ducts or elongated depressions of the channel 14. The channel 14 is rectangular in cross-section and extends the entire depth of the oxide layer 12. The width of the channel is of minimum dimension $L_{MIN}$, as later defined herein, and can be as small as a few microns.

After the channel 14 is formed, a thin oxide layer 16 of about 1000 Å is grown on the silicon substrate 10. The thin silicon dioxide layer 16 serves to define the minimum spacing of the electrode structures from the surface of the silicon substrate 10. Now it is possible to carry out a series of processing steps that will deposit a plurality of memory bits or charge storage elements, in this example 9 bits, in the channel 14.

Reference is now made in particular to FIGS. 5–9 which are viewed from the same aspect as a horizontal section taken along the length of the channel 14, such as along line 9—9 of FIG. 1. A layer 18 of silicon nitride is deposited on the thin silicon dioxide layer 16, and with the aid of a mask 20, employed in conjunction with photolithographic techniques, the silicon nitride layer 18 is patterned to form a plurality of separate rectangular areas arranged in checkerboard fashion or staggered array. The rectangular areas have a width W and lateral spacing S equal to the minimum dimension $L_{MIN}$. The rectangular areas of the silicon nitride layer 18 are shown more clearly in FIG. 1. Each rectangular area includes a half portion 18a which is later removed and is shown bounded by the phantom lines, and another portion 18b which remains as a permanent part of the structure and is shown bounded by the shorter dashed lines. The pattern of the silicon nitride layer 18 will be used to introduce the asymmetry into the array. The silicon nitride layer may be typically 2000 Å thick.

Figure 6:
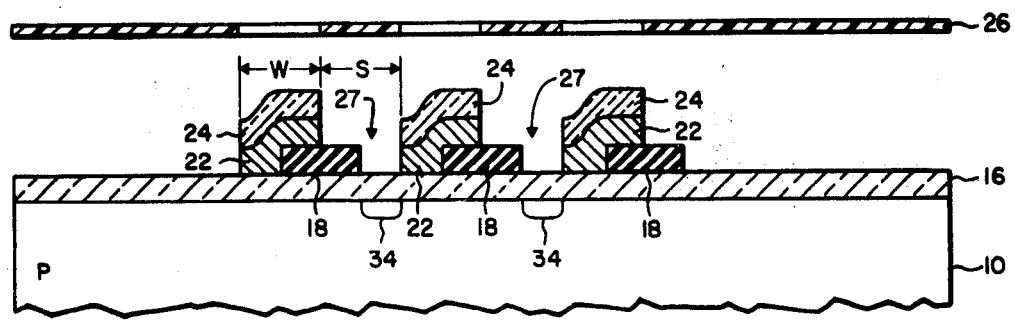

Next a layer 22 of polycrystalline silicon, hereinafter referred to as polysilicon, and a layer 24 of silicon dioxide are laid down in that order, and with the aid of a mask 26 and photolithographic techniques, the two layers 22 and 24 are patterned to form a plurality of strips crossing perpendicular to the channel 14. The strips also have a width W and a spacing S equal to those of the channel 14, each dimension being equal to the minimum dimension $L_{MIN}$. A half portion of the polysilicon layer 22 rests on the thin silicon dioxide layer 16 and the other half portion rests on the silicon nitride layer 18, as shown in FIG. 6. Also, the polysilicon layer 22 covers only a half portion of the silicon nitride layer 18, the other half of the silicon nitride layer 18 being bare. The silicon dioxide layer 24 is positioned directly on the polysilicon layer 22. The polysilicon layer 22 may be 5000 Å thick and the silicon dioxide layer 24 may be 3000 Å thick. The polysilicon layer 22 is electrically conductive, whereas the silicon dioxide layer 16 and silicon nitride layer 18 are electrically insulating.

It will be seen at this stage that the portion of the polysilicon layer 22 resting on the thin silicon dioxide layer 16 is spaced closer to the silicon substrate 10 than the portion of the polysilicon layer 22 resting on the silicon nitride layer 18. Thus, the capacitance of the polysilicon layer 22 to the substrate 10 is asymmetrical. Since the polysilicon layer 22 constitutes one of the gate electrodes, the asymmetrical capacitance thereof will produce an asymmetrical potential well distribution in the silicon substrate surface directly beneath it, which potential well distribution will define the directionality of the charge flow, as will be further explained.

It will also be noted at this point that a second gate electrode must be constructed to overlie the regions between the strips of the polysilicon layer 22 or first gate electrode. It is also necessary to perform certain processing steps that result in the formation of a structure beneath the second gate electrode that will produce an asymmetrical potential well distribution of the same charge directional sense as that produced beneath the polysilicon layer 22 or first gate electrode. The desired asymmetry can be achieved in either of two ways or by a combination thereof. First, it will be observed that the region 27 where the thin silicon dioxide layer 16 is exposed has only the thin silicon dioxide layer 16 between it and the silicon substrate 10, whereas all other regions are separated from the substrate 10 by much thicker layers. Accordingly, an ion implant may be performed in the region 27 to adjust the threshold potential there in a manner to create the desired potential well asymmetry. Additionally, the region 27 also is the only region where it is possible to rapidly grow an appreciable thickness of silicon dioxide. Therefore, the silicon dioxide can be substantially thickened in this region 27 as compared to the other regions and the capacitance asymmetry thereby attained will produce the desired potential well asymmetry. This latter approach will now be described first.

Referring now to FIG. 7, a thermal oxide is grown on top of the thin silicon dioxide layer 16 and on the vertical faces respectively of the polysilicon layer 22 and thick silicon dioxide layer 24. The growth of thermal oxide is carried out until the thickness is at least equal to or exceeds the thickness of the silicon nitride layer 18. At this stage it will be observed that all regions except portions of the silicon nitride layer 18 are covered with silicon dioxide. Now it is possible to etch away the exposed silicon nitride, as shown in FIG. 8, leaving intact the portions of the silicon nitride layer 18 beneath the polysilicon layer 22.

Figure 9A:
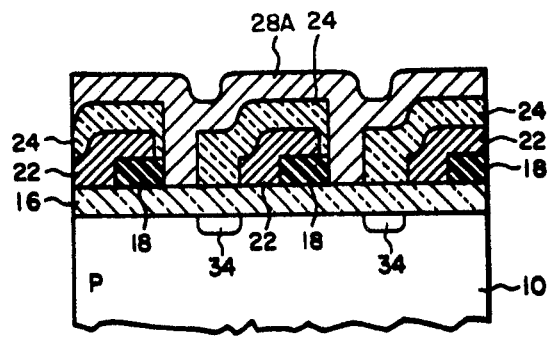
FIG. 9a is a sectional view showing a modification of the structure shown in FIG. 9.

The final step is to deposit a layer 28 of metal over the entire structure. The metal layer 28 shown in FIG. 9 may comprise strips interdigitated with the polysilicon layer 22, where an overlap of metal is provided sufficient to allow for mask alignment errors. It is necessary that the metal layer 28 cover at least the entire space between the strips of the polysilicon layer 22. However, it may cover the entire surface area including the polysilicon layer itself, since the polysilicon layer 22 shields the effect of the metal gate from the substrate regions beneath the layer 22. This construction is shown in FIG. 9a as a continuous metal layer 28a. When the metal is allowed to cover the entire surface area including the polysilicon layer 22, the performance suffers somewhat because the added capacitance of the metal to polysilicon gates makes it necessary to supply added drive power. The metal layer 28 may comprise 14,000 A of aluminum and constitutes the second gate electrode.

Now in the region between the polysilicon gate electrode 22 it will be seen that the left-hand portion of the second gate electrode 28 is separated from the silicon substrate 10 by the thin silicon dioxide layer 22, whereas the right-hand portion is separated from the silicon substrate 10 by an additional thick layer 24 of silicon dioxide. Similarly, the left-hand portion of the polysilicon layer 22 is closed to the silicon substrate 10 than is the right-hand portion thereof. It will be appreciated therefore that the asymmetry in capacitance for both electrodes constituted by the layers 22 and 28 is in the same sense, and the potential well distribution resulting therefrom will have the proper asymmetry to cause unidirectional flow of charge.

FIG. 9b shows a typical potential well distribution 30 created in the silicon substrate 10 beneath the gate electrodes or layers 22 and 28. A potential well may be thought of simply as the spatial distribution of the depletion layer formed by the application of a suitable voltage to one of the electrodes of the charge coupled device. For example, for a p-type substrate, a positive voltage of about 5 volts applied to the polysilicon gate electrode layer 22 will cause an inversion in the silicon semiconductor substrate 10 surface beneath the energized electrode. In the regions where the polysilicon gate electrode layer is spaced closer to the substrate, that is, spaced only by the thin silicon dioxide layer 16, the surface potential is greater, and therefore the depth of the potential well, or the degree of inversion is greater than in the adjacent regions where the polysilicon gate electrode layer 22 is spaced from the substrate additionally by the silicon nitride layer 18. A similar potential well distribution occurs from the application of a positive potential to the second gate electrode layer 28, giving rise to the asymmetrical potential well distribution 30.

Once the potential wells are created in the silicon substrate surface, the device can store charge carriers. The appropriate charge carriers can be injected by an input p-n junction at the locations generally shown at 32 are labeled input interface. Alternatively, the carriers can be injected by irradiating the device with light, in which case portions of the second metal gate electrode layer 28 can be removed to expose the semiconductor substrate surface through the polysilicon layer 22.

Once the charges are injected, they are stored in the particular potential well location and remain there until they are caused to move or shift to an adjacent potential well location. The stored charges or carriers can move only from a shallow potential well to a deeper one, in the direction of the arrows shown in FIG. 9b. To shift the charge from one location to the next, a higher positive voltage of 10 volts is applied momentarily to one of the gate electrodes, say the polysilicon gate electrode layer 22, to form deeper potential wells therebeneath, as indicated by the deeper wells 31, shown in dotted lines. Stored charges located in any potential wells beneath the second gate electrode layer 28 will be attracted and flow, in the direction of the arrows shown in FIG. 9b, to a deeper well beneath the polysilicon gate electrode layer 22. The voltage on the polysilicon gate electrode layer 22 is then returned to its former value of 5 volts positive.

To shift the charge a second time, the other electrode is energized momentarily. Thus, a positive voltage of 10 volts is momentarily applied to the second gate electrode layer 28 to create deeper potential wells at those locations between the layer 28 and cause the stored charges to shift from the locations beneath the first gate electrode layer 22 to the next adjacent locations beneath the second gate electrode layer 28. The voltage on the second gate electrode layer 28 is then returned to its former value of 5 volts positive. The process of shifting charge can then be repeated over and over again by pulsing first one electrode and then the other in the same manner described.

Charge can also be shifted by making the initially established potential wells shallower in alternating sequence. That is, by momentarily reducing the voltage from 5 volts positive to zero, first on one electrode and then the other, the potential wells under the reduced electrode potentials are made shallower than their neighboring potential wells and stored charge can still flow from the shallower wells to the adjacent deeper wells.

In the case of an n-type semiconductor substrate, the applied potentials are negative instead of positive because the minority carriers are holes instead of electrons.

As was indicated above, it is also possible to alter the threshold potential by implanting impurity ions in selected areas of the semiconductor substrate 10. For example, returning to the stand of processing illustrated in FIG. 6, it can be seen that the region 27 has only a thin layer 16 of silicon dioxide covering the semiconductor substrate 10, whereas all the other regions have additional layers of material covering the substrate. Accordingly, the regions 27 may be subjected to ion implantation processing, to produce an ion implanted region 34. For the p-type substrate 10 the ion impurity is p-type and for an n-type substrate the ion impurity is n-type. In each case the impurity dopant has the effect of raising the threshold voltage, or the voltage required to produce an inversion in the substrate surface and create the depletion layer. For example, in a p-type substrate the majority carriers are holes. By adding a p-type impurity the concentration of holes is increased. Therefore the threshold voltage required to produce an inversion to electrons at the substrate surface is increased, say from about 2 to 4 volts positive to about 5 to 8 volts positive. Increasing the threshold voltage is analogous to reducing the depth of the depletion layer and the potential well.

For implanting a p-type impurity, boron ions may be injected at an implantation energy of 50 to 200 kilovolts to penetrate the thin silicon dioxide layer 16 without penetrating the other regions, and thereby localize the dopant distribution near the silicon substrate surface. The device may then be heated in a diffusion furnace at a temperature of about 900°-1000° C. for 10 to 20 minutes to facilitate the desired threshold shift.

Following the ion implantation, the processing may be continued in the manner described above in connection with FIGS. 7-9. With such a procedure, the selective ion implant and the stepped oxide layer 24 may combine to produce the desired asymmetry in the potential wells beneath the second gate electrode layer 28. Alternatively the ion implant may be utilized by itself to produce the desired asymmetry beneath the second gate electrode layer 28, in which case the procedure is as follows.

Figure 10:
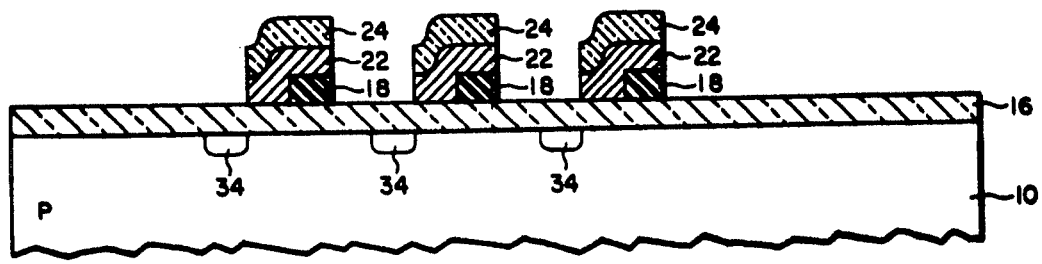
FIGS. 10-13 are sectional views showing additional modified structures according to the invention.
Figure 11:
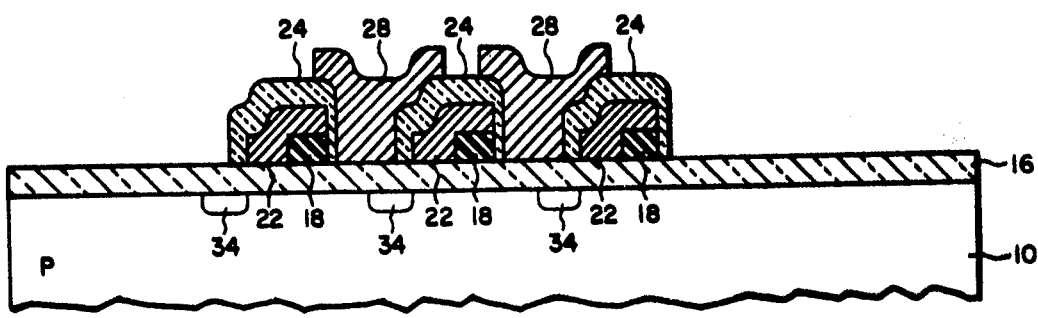

Referring to FIGS. 10 and 11, the exposed portion of the silicon nitride layer 18 shown in FIG. 6 is etched away. Next, the device is heated to thermally grow an extension of the thick oxide layer 24 on the vertical edges of the polysilicon layer 22. When the polysilicon layer 22 is sufficiently covered with oxide to insulate it electrically, the second metal layer 28 may then be deposited. In the resulting structure shown in FIG. 11, the potential well asymmetry under the polysilicon gate electrode layer 22 results from the asymmetrical or stepped insulation spacing provided by the thin silicon dioxide layer 16 and silicon nitride layer 18, of the polysilicon layer 22 from the substrate 10. On the other hand, the potential well asymmetry under the metallic gate electrode layer 28 results from the layer 28 overlying both an implanted region 34 and a contiguous non-implanted region, each of which are spaced the same distance from the layer 28 by the thin oxide layer 16.

Figure 12:
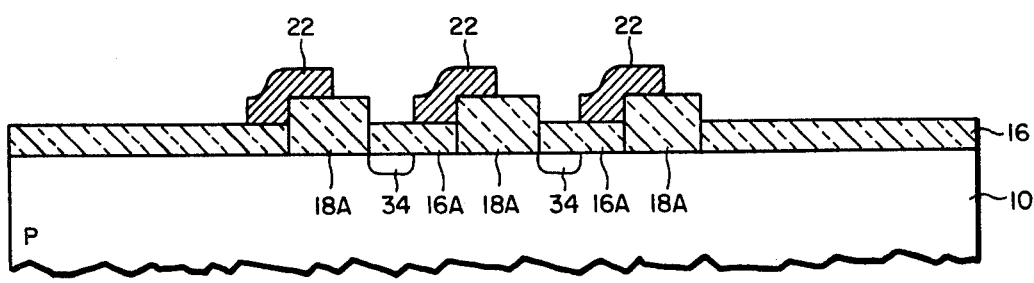
Figure 13:
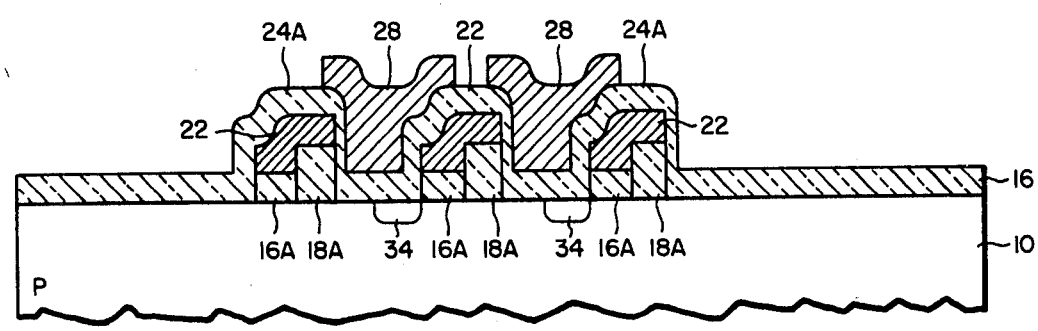

Another embodiment which uses a thickened silicon dioxide layer instead of the silicon nitride layer 18 is shown in FIGS. 12 and 13. There is grown on the semiconductor substrate 10 a layer of silicon dioxide that has thicker regions 18a separated by thinner regions 16a. The thicker regions 18a of oxide correspond to the silicon nitride layer 18 of the previous embodiments. A structure with thick and thin regions of silicon dioxide may be formed by growing a thick oxide layer of uniform thickness, patterning and etching away through the entire thickness of the oxide exept for the thick regions 18a, and then regrowing a thin oxide layer to form the thin oxide regions 16a.

The stepped polysilicon layer 22 is next deposited partly on the thick oxide regions 18a and partly on the thin oxide regions 16a. Ion implants 34 are next formed in the substrate 10 beneath the areas of the thin oxide regions 16a that are not covered by the polysilicon layer 22.

The silicon dioxide is then stripped away from all of the areas not covered by the polysilicon layer 22 down to the base substrate 10, following which a thin silicon dioxide layer 24A is grown over the entire structure. Finally, the second metal layer 28 is deposited on the silicon dioxide layer 24A to overlie the spaces between the polysilicon layer 22.

Referring back to FIG. 5, the first mask 20 shown as being used to form the silicon nitride layer 18, may be referred to as an offset mask and the silicon nitride layer 18 may be referred to as the offset mask pattern. The first mask 20 and the silicon nitride layer 18 are both physically displaced or offset from the second mask 26 that determine the location of both the polysilicon electrode layer 24 and also the metal electrode layer 28. The silicon nitride layer 18 itself has a physically defined pattern that serves as a processing mask to introduce the proper asymmetry in both the electrode layers 22 and 28. Firstly, it locates and produces the step in the polysilicon layer 22 and the asymmetry resulting therefrom. Secondly, it locates the region 27 shown in FIG. 6 that defines the area for the ion implant and the area for the selective growth of additional silicon dioxide, both of which serve to introduce the asymmetry associated with the metal electrode layer 28. After the second mask 26 is used to locate the polysilicon layer 22, the silicon nitride layer 18 itself is used as an in situ mask in conjunction with the superposed layers and further processing steps to complete the fabrication of the structure with the aid of the self registering property of the in situ mask. Thirdly, the checkerboard design of the offset mask pattern produced in the silicon nitride layer 18 and the straight line arrangement of the polysilicon and metal electrode clock lines which results from the construction of a serpentine array is responsible for the high bit density of the array.

Almost all critical alignment has been eliminated in the fabrication of this device structure by the self-alignment which is inherent in the overlapping electrode silicon gate process. The alignment of the silicon nitride offset to the polysilicon pattern will affect the performance however. If the offset pattern is not exactly symmetrical with respect to the polysilicon pattern, then adjacent pairs of storage and transfer wells will necessarily be of different size. The charge capacity of the array will then be limited by the smallest storage well. In the worst case, the smallest storage well will have a length equal to the nominal value minus the mask misalignment tolerance. This ultimately limits the value of the minimum dimension, $L_{MIN}$, to be larger than the alignment error of the offset to the polysilicon mask. The degree larger depends on the desired noise margin of the system. As it applies to the manufacture of integrated circuits by photolithographic masking and etching techniques, the term minimum dimension means the smallest line width which can be produced by a single mask layer according to the current state of the art. This dimension is currently in the range of 1 to 10 microns, the specific value depending upon the particular set of processing steps being used and the production yield that is desired.

In the Table below, there is summarized the performance of the high density two-phase CCD arrays as compared to conventional overlapping gate two-phase CCD arrays for both serpentine and parallel signal flow assuming equal clock voltage amplitudes. There is listed the bit area A; the storage region length L; the active channel width W; the storage region area $A_S$; on-chip power dissipation $P_D$; the signal to noise ratio SNR; the relative values of the highest clock frequency for acceptable performance, $F_H$; and the relative values of the signal degradation of the incomplete charge transfer due to trapping in interface states at low and moderate clock frequencies, $F_L$.

TABLE

|  | Bit Area $A$ | Storage Region Length L | Active Channel Width W | Storage Region Area $A_S$ | Power Dissipation $P_D$ | Signal to Noise Ratio SNR | Highest Clock Frequency $F_H$ | Signal Degradation at Low Drive Frequencies $F_L$ |
|---|---|---|---|---|---|---|---|---|
| Conventional two-phase overlapping gates CCD arrays Parallel signal flow | $8 L_{MIN}^2$ | $L_{MIN}$ | $L_{MIN}$ | $L_{MIN}^2$ | $P_D$ | 1 | $F_H$ | $E_L$ |
| Serpentine signal flow | $16 L_{MIN}^2$ | $L_{MIN}$ | $L_{MIN}$ | $L_{MIN}^2$ | $P_D$ | 1 | $F_H$ | $E_L$ |
| High density two-phase CCD array Active channel width $W = L_{MIN}$ | $4 L_{MIN}^2$ | $\frac{L_{MIN}}{2}$ | $L_{MIN}$ | $\frac{1}{2} L_{MIN}^2$ | $\frac{1}{2} P_D$ | $\frac{1}{\sqrt{2}}$ | $>4 F_H$ | $E_L$ |
| Active channel width $w = 2 L_{MIN}$ | $6 L_{MIN}^2$ | $\frac{L_{MIN}}{2}$ | $2 L_{MIN}$ | $L_{MIN}^2$ | $P_D$ | 1 | $>4 F_H$ | $\frac{1}{2} E_L$ |

In comparing the signal to noise ratio it is assumed that the SNR is proportional to the square root of the storage region area. Almost all the noise introduced at the input and during the storage and transfer of the charge in the device, are proportional to the square root of the gate area. The input signal noise (thermal or shot noise) and the background charge noise (whether thermally, optically or electrically generated); the noise introduced to the signal charge in the storage process through the leakage and thermal generation current; the noise introduced during the transfer process through the fluctuation of the carriers trapped in the interface states and through suppressed transfer loss fluctuation are propositional to the square root of the gates area.

But the maximum signal charge is directly proportional to the gate area. Hence the SNR and dynamic range is proportional to the square root of the gate area.

The highest clock frequency is determined by incomplete free charge transfer. See, for example, C. N. Berglund and R. J. Strain, "Fabrication and Performance Considerations of Charge Transfer Dynamic Shift Registers," Bell System Technical Journal 51, 1972, p. 655-703. At low and moderate clock frequencies trapping in the interface states under the edges of the gates parallel the active channel limits the performance of the device and the signal degradation $E_L$ is inversely proportional to the active channel width. When overlapping gates charge coupled devices are operated with a circulating background charge, trapping in the interface states under edges of the gates parallel to active channel is dominant at moderate and low clock frequencies. The parallel edges are the areas parallel to the channel at the interface under the gates which are covered by the signal charge and are not covered by the background charge. So the parallel edges are residual areas of the channel that the background charge does not reach. The resulting signal degradation is inversely proportional to the channel width and depends on the information content of the signal. See for example: A. M. Mohsen, T. C. McGill, and Y. Darman, "The Influence of Interface States on Incomplete Charge Transfer in Overlapping Gates Charge Coupled Devices," IEEE Journal of Solid State Circuits, No. 2, April 1973.

Due to the reduction of the lengths of the storage and transfer regions and the resulting increase in the fringing fields, the highest clock frequency of the high density CCD structure is increased by more than a factor of 4 over the conventional two-phase structure. Due to the smaller storage capacitors, the power dissipation is reduced. The reduction of the SNR in the high density structure due to the smaller storage regions can be compensated by increasing the active channel width W. This reduces also the signal degradation at low clock frequencies $E_L$. In this case the bit area of the high density structure is still less than that of the conventional two-phase structure.

There has been described herein means for obtaining very high density CCD arrays with excellent performance characteristics. The advantages of the disclosed structure are obtained with a standard overlapping gate polysilicon process utilizing conventional mask tolerances. Furthermore, the processing steps used in the construction of the CCD array are compatible with those used in MOS techniques so that CCD and MOS structures can be fabricated contemporaneously in the same substrate. By means of the invention a bit area of 4 $(L_{MIN})^2$ is achieved for both parallel and serpentine two-phase arrays as contrasted with prior art yields of about 8 $(L_{MIN})^2$ for parallel flow arrays and 16 $(L_{MIN})^2$ for serpentine arrays. For gate electrodes having a minimum width dimension $L_{MIN}$ of approximately 0.3 mil, the structure according to the invention yields a packing density in excess of $3 \times 10^6$ bits/in$^2$. Charge flow directionality is developed within a single gate of minimum width rather than within pairs of adjacent gates or within a single gate that is twice the minimum width.

What is claimed is:

1. A method of fabricating a two-phase charge coupled device of high component density, comprising:
    (a) providing a first mask having laterally spaced component forming areas that are substantially equal in lateral width and spacing to a predetermined minimum line width;
    (b) forming on a surface of a semiconductor substrate at least in part by means of said first mask on array of thick insulating areas separated from each other laterally by thinner insulating regions, with said thick insulating areas having corresponding lateral width and spacing substantially equal to said predetermined line width;
    (c) providing a second mask having laterally spaced component forming areas that are substantially equal in lateral width and spacing to said predetermined minimum line width;
    (d) disposing said second mask over said insulating array with its component forming areas laterally displaced from said thick insulating areas by a distance such that a portion of said component forming area overlies said thick insulating areas and the remaining portion overlies said thinner insulating regions;
    (e) forming on said insulating array by means of said second mask a first set of laterally spaced gate electrodes each of which covers a portion of said thick insulating areas and the remaining portion covers the adjacent portion of said thinner insulating regions, the remaining portions of said thick insulating areas and said thinner insulating regions being devoid of said gate electrodes;
    (f) coating with an insulating layer said first set of gate electrodes and the portions of said thinner insulating regions that are devoid of said gate electrodes;
    (g) removing the portions of said thick insulating areas that are devoid of said gate electrodes at least to a depth substantially below the surface of said insulating layer coating the portions of said thinner insulating regions that are devoid of said gate electrodes; and
    (h) depositing a second set of gate electrodes over said insulating layer referred to in clause (f) and interleaved with said first set of gate electrodes so as to overlie at least the interelectrode spaces therebetween.

2. The invention according to claim 1, and further including, following step (c):
    (i) exposing the structure thus formed to a stream of impurity ions of sufficient energy to penetrate said semiconductor surface and form an implant in the regions thereof aligned with said thinner insulating regions but without penetrating any other regions of said semiconductor surface.

3. A method of fabricating a two-phase charge coupled device of high component density, comprising:
    (a) providing a first mask having laterally spaced component forming areas that are substantially equal in lateral width and spacing to a predetermined minimum line width;
    (b) forming on a surface of a semiconductor substrate at least in part by means of said mask an array of thick insulating areas separated from each other laterally by thinner insulating regions, with said thick insulating areas having corresponding lateral width and spacing substantially equal to said predetermined minimum line width;
    (c) providing a second mask having laterally spaced component forming areas that are substantially equal in lateral width and spacing to said predetermined minimum line width;

(d) disposing said second mask over said insulating array with its component forming areas laterally displaced from said thick insulating areas by a distance such that a portion of said component forming area overlies said thick insulating areas and the remaining portion overlies said thinner insulating regions;

(e) forming on said insulating array by means of said second mask a first set of laterally spaced gate electrodes each of which covers a portion of said thick insulating areas and the remaining portion covers the adjacent portion of said thinner insulating regions, the remaining portions of said thick insulating areas and said thinner insulating regions being devoid of said gate electrodes;

(f) exposing the structure thus formed to a stream of impurity ions of sufficient energy to penetrate said semiconductor surface and form an implant in the regions thereof aligned with said thinner insulating regions but without penetrating any other regions of said semiconductor surface;

(g) removing so much thickness of the portions of said thick insulating areas that are devoid of said gate electrodes that the remaining thickness is about the same as that of said thin insulating regions;

(h) coating said first set of gate electrodes with an insulating layer; and (i) depositing a second set of gate electrodes over said insulating layer, said insulating areas, and said insulating regions and interleaved with said first set of gate electrodes so as to overlie at least the interelectrode spaces therebetween.

4. The invention according to claim 3, wherein said semiconductor substrate comprises silicon of a given type semiconductivity, said thick insulating areas comprise a layer of silicon oxide and a layer of silicon nitride superimposed on said substrate in that order, and said thinner insulating regions comprise a layer of silicon oxide.

5. The invention according to claim 4, wherein said impurity ions are of the same type as is contained in the remainder of said silicon substrate.

6. The invention according to claim 3, wherein said semiconductor substrate comprises silicon of a given type semiconductivity and both said thick insulating areas and also said thinner insulating regions are formed entirely of silicon oxide.

* * * * *

UNITED STATES PATENT OFFICE
CERTIFICATE OF CORRECTION

PATENT NO. : 4,148,132

DATED : April 10, 1979

INVENTOR(S) : Robert W. Bower

It is certified that error appears in the above-identified patent and that said Letters Patent are hereby corrected as shown below:

Col. 1, line 9 "Asymetorial Wall" should be cancelled and --Asymmetrical Well-- substituted therefor.

Col. 2, line 18 "9ais" should be cancelled and --9a is-- substituted therefor.

Col. 6, line 6 "stand" should be cancelled and --stage-- substituted therefor.

Col. 8 approx. line 41 of the Table, in the heading "Signal Degradation at Low Drive Frequencies $F_L$" cancel "$F_L$" and substitute --$E_L$-- therefor.

line 68 "propositional" should be cancelled and --proportional-- substituted therefor.

UNITED STATES PATENT AND TRADEMARK OFFICE
CERTIFICATE OF CORRECTION

PATENT NO. : 4,148,132

DATED : April 10, 1979

INVENTOR(S) : Robert W. Bower

It is certified that error appears in the above–identified patent and that said Letters Patent are hereby corrected as shown below:

Col. 10, line 4 "on" should be cancelled and --an-- substituted therefor.

line 45 "(c)" should be cancelled and --(e)-- substituted therefor.

Signed and Sealed this

Twenty-fourth Day of July 1979

[SEAL]

Attest:

LUTRELLE F. PARKER

Attesting Officer

Acting Commissioner of Patents and Trademarks